(12) United States Patent
Ichiki et al.

(10) Patent No.: US 6,849,857 B2
(45) Date of Patent: Feb. 1, 2005

(54) BEAM PROCESSING APPARATUS

(75) Inventors: Katsunori Ichiki, Kanagawa (JP);
Kazuo Yamauchi, Kanagawa (JP);
Hirokuni Hiyama, Kanagawa (JP);
Seiji Samukawa, Miyagi (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/471,610

(22) PCT Filed: Mar. 22, 2002

(86) PCT No.: PCT/JP02/02749

§ 371 (c)(1),
(2), (4) Date: Sep. 29, 2003

(87) PCT Pub. No.: WO02/078043

PCT Pub. Date: Oct. 3, 2002

(65) Prior Publication Data

US 2004/0108469 A1 Jun. 10, 2004

(30) Foreign Application Priority Data

Mar. 26, 2001 (JP) ........................ 2001-088863

(51) Int. Cl.[7] .............................................. H01J 37/00
(52) U.S. Cl. .......................... 250/492.21; 118/723 MR; 156/345; 315/111.21
(58) Field of Search ............. 250/492.21; 118/723 MR; 156/345; 315/111.21, 111.4

(56) References Cited

U.S. PATENT DOCUMENTS

| | | | |
|---|---|---|---|
| 4,987,346 A | | 1/1991 | Katzschner et al. |
| 5,279,669 A | * | 1/1994 | Lee ..................... 118/423 MR |
| 5,818,040 A | | 10/1998 | Kinoshita et al. |
| 6,051,151 A | | 4/2000 | Keller et al. |

FOREIGN PATENT DOCUMENTS

| | | | |
|---|---|---|---|
| EP | 1 220 272 | 7/2002 | |
| EP | 1 220 272 A1 | * 7/2002 | .......... H01J/227/16 |
| GB | 2 349 506 | 11/2000 | |
| WO | WO 01/06534 | 1/2001 | |

OTHER PUBLICATIONS

Walther, S, "Methods and Apparatus for Plasma Doping and Ion implantation in an Integrated Processing System", Publication No: US 2003/0082891 A1, published May 1, 2003.*
European Patent Office, Patent Abstracts of Japan, Publication No. 57042131, dated Mar. 9, 1982. Cited in the int'l. search report.
European Patent Office, Patent Abstracts of Japan, Publication No. 2000100798, dated Apr. 7, 2000. Cited in the int'l. search report.
European Patent Office, Patent Abstracts of Japan, Publication No. 09162169, dated Jun. 20, 1997. Cited in the int'l. search report.

* cited by examiner

Primary Examiner—John R. Lee
Assistant Examiner—Zia R. Hashmi
(74) Attorney, Agent, or Firm—Westerman, Hattori, Daniels & Adrian, LLP

(57) ABSTRACT

A beam processing apparatus comprises a workpiece holder (20) for holding a workpiece (X), a plasma generator for generating a plasma in a vacuum chamber (3), first electrode (4) disposed in the vacuum chamber (3), and a second electrode (5) disposed upstream of the first electrode (4) in the vacuum chamber (3). The beam processing apparatus further comprises a voltage applying unit for applying a variable voltage between the first electrode (4) and the second electrode (5) to alternately extract positive ions (6) and negative ions from the plasma generated by the plasma generator.

10 Claims, 13 Drawing Sheets

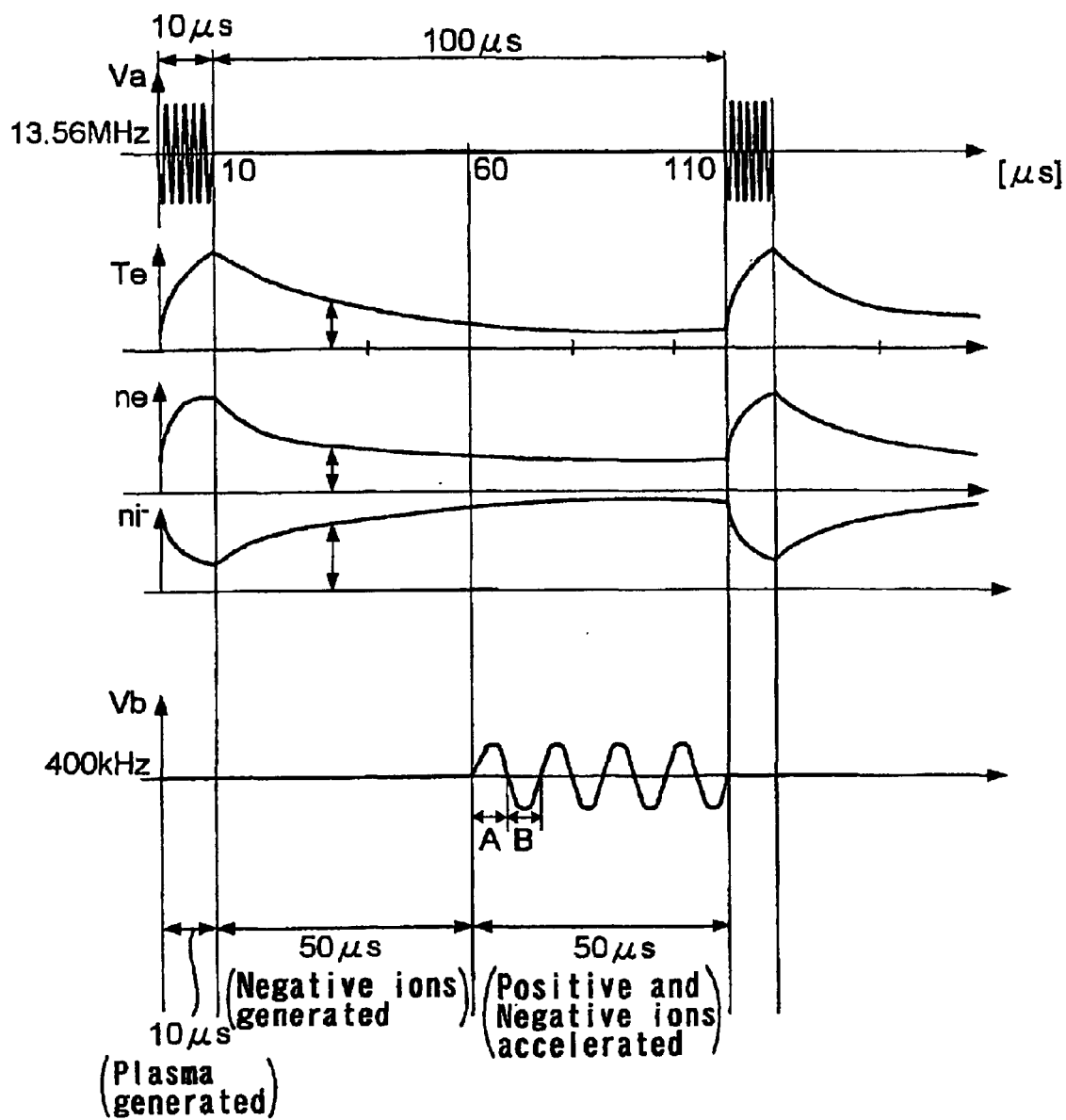

F I G. 1 3
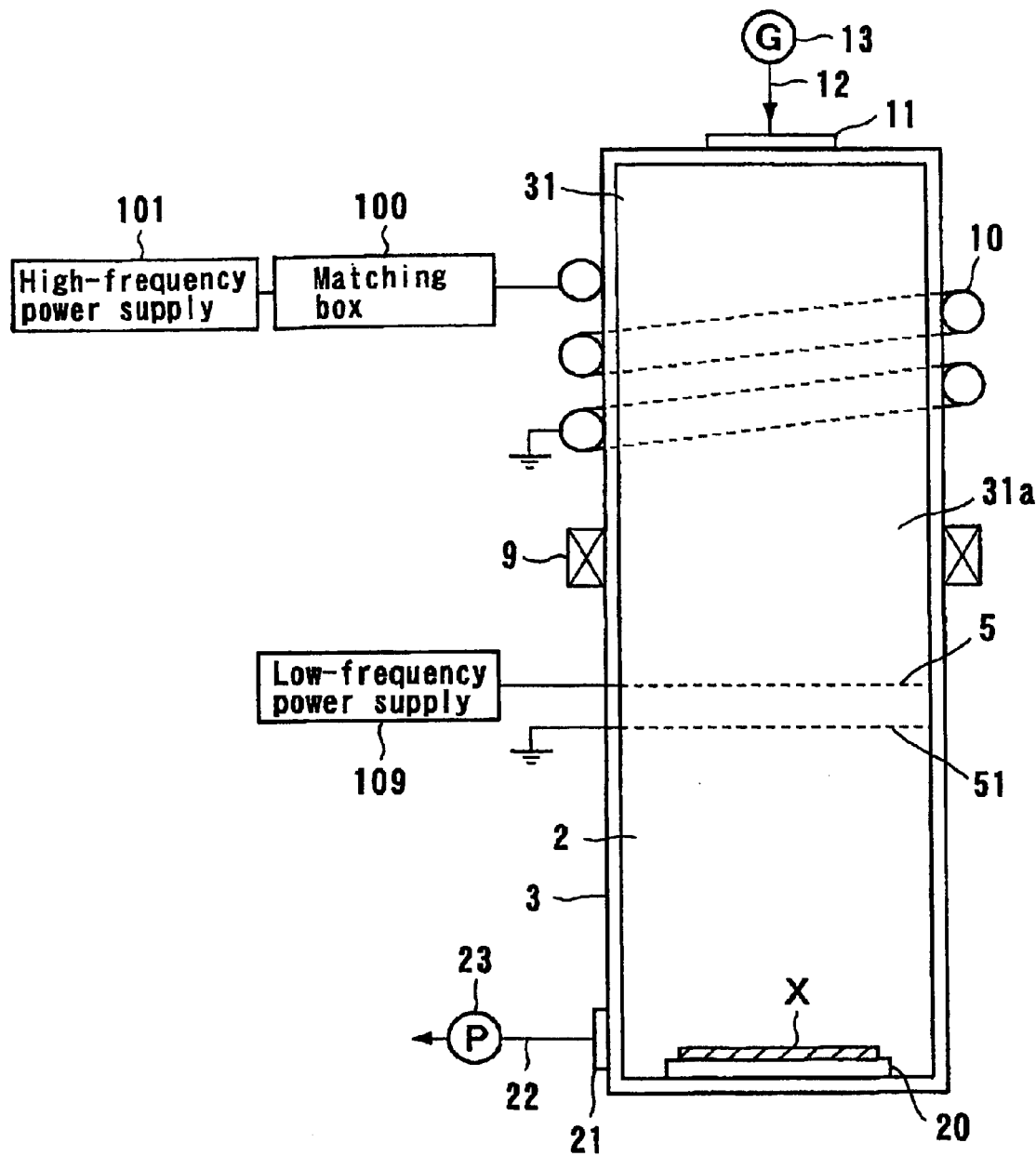

BEAM PROCESSING APPARATUS

BACKGROUND ART

The present invention relates to a beam processing apparatus, and more particularly to a beam processing apparatus for generating a highly directional and highly dense particle beam from a high-density plasma and processing a workpiece with the generated particle beam.

TECHNICAL FIELD

In recent years, semiconductor integrated circuits, information storage media such as hard disks, micromachines, and the like have been processed in highly fine patterns. In the fields of processing such workpieces, attention has been attracted to the use of an energetic beam such as a high-density ion beam which is highly linear, i.e., highly directional, and has a relatively large beam diameter. For example, the energetic beam is applied to a workpiece for depositing a film thereon or etching the workpiece.

As beam sources of such energetic beams, there have been used beam generators which generate various kinds of beams including a positive ion beam, a negative ion beam, and a radical beam. The positive ion beam, the negative ion beam, or the radical beam is applied to a desired area of a workpiece from the beam source, for thereby locally depositing a film on the workpiece, etching the workpiece, modifying the surface of the workpiece, or joining or bonding parts of the workpiece.

In the case of a beam source which applies charged particles such as positive ions or negative ions to a workpiece, an insulated workpiece cannot be processed because of a charge build-up phenomenon in which electric charges are built up on the workpiece. Further, since the ion beam emitted from the beam source tends to spread due to the space-charge effect, the workpiece cannot be processed in a fine pattern.

In order to solve the above problems, there has been proposed a method of introducing electrons into the ion beam to neutralize the electric charges. This method can balance the electric charges on the workpiece on the whole. However, since local unbalance of the electric charges still remains on the workpiece, the workpiece cannot be processed in a fine pattern.

In the case where ions are extracted from a plasma source and applied to a workpiece, if a radiation (e.g., an ultraviolet ray) produced by the plasma source is applied to the workpiece, then the radiation adversely affects the workpiece. Thus, it is necessary to shield the workpiece from an adverse radiation (e.g., an ultraviolet ray) emitted from the plasma source.

DISCLOSURE OF INVENTION

The present invention has been made in view of the above drawbacks. It is therefore an object of the present invention to provide a beam processing apparatus which can apply an energetic beam having a large beam diameter to a workpiece with an inexpensive and compact structure, and can neutralize ions with a high neutralization efficiency to process the workpiece without a charge build-up or damage.

According to a first aspect of the present invention, there is provided a beam processing apparatus comprising: a workpiece holder for holding a workpiece; a plasma generator for generating a plasma in a vacuum chamber; a first electrode disposed in the vacuum chamber; a second electrode disposed upstream of the fist electrode in the vacuum chamber; and a voltage applying unit for applying a variable voltage between the first electrode and the second electrode to alternately extract positive ions and negative ions from the plasma generated by the plasma generator.

With the above arrangement, positive ions and negative ions can alternately be extracted from a plasma. The extracted positive and negative ions are neutralized and applied as a neutral particle beam to the workpiece, or directly applied as a positive ion beam and a negative ion beam to the workpiece.

The plasma generator may generate the plasma by applying a high-frequency electric field. The beam processing apparatus may further comprise a negative ion generating chamber disposed downstream of the plasma generator for attaching electrons to a residual gas to generate negative ions therein. The negative ion generating chamber may have an electron cloud generator for generating an electron cloud within the negative ion generating chamber.

According to a second aspect of the present invention, there is provided a beam processing apparatus comprising: a workpiece holder for holding a workpiece; a first electrode disposed in a vacuum chamber; a second electrode disposed upstream of the fist electrode in the vacuum chamber; and a voltage applying unit for applying a variable voltage between the first electrode and the second electrode to generate a plasma between the first electrode and the second electrode and to alternately extract positive ions and negative ions from the generated plasma.

With the above arrangement, positive ions and negative ions can alternately be extracted from a plasma. The extracted positive and negative ions are neutralized and applied as a neutral particle beam to the workpiece, or directly applied as a positive ion beam and a negative ion beam to the workpiece. Particularly, the voltage applying unit serves not only to extract the positive ions and the negative ions, but also to generate the plasma. Therefore, it is not necessary to provide a separate plasma generator for generating a plasma. Thus, the beam processing apparatus can be made compact in structure, and a beam diameter of an energetic beam can be increased inexpensively.

According to a preferred aspect of the present invention, the beam processing apparatus further comprises a neutralization device for alternately neutralizing the positive ions and the negative ions extracted by the voltage applying unit.

With the above arrangement, positive ions and negative ions can alternately be extracted from a plasma. The extracted positive and negative ions are neutralized and applied as a neutral particle beam to the workpiece. Since the workpiece can be processed by the neutral particle beam having no electric charges but having a large translational energy, various processes including an etching process and a deposition process can be performed on the workpiece with high accuracy in such a state that an amount of charge build-up is reduced. Further, the neutral particles generated by neutralization of the positive ions and the neutral particles generated by neutralization of the negative ions are alternately applied to the workpiece. Therefore, two types of processes are alternately performed on the workpiece. For example, when gases of $Cl_2$ and Xe are introduced into the vacuum chamber, the workpiece is sputtered with use of Xe generated by neutralization of the positive ions and etched with use of chlorine generated by neutralization of the negative ions. In this case, the etching rate can be enhanced by chemical sputtering effect. For example, a chlorine beam is applied to a workpiece to form thereon several atomic layers in which the chlorine and the workpiece are weakly bonded to each other, and then a Xe beam is applied to the workpiece. When the energy of the Xe beam is larger than the energy required for removing the atomic layers in which the chlorine and the workpiece are weakly bonded to each other, but is smaller than the energy required for removing the atomic layers in the workpiece which have a large bonding strength, the Xe beam can sputter the workpiece to remove only the atomic layers in which the chlorine and the workpiece are weakly bonded to each other. Thus, when reaction processes are properly selected and the energy of a beam is properly controlled, a workpiece can be etched without defect of the crystal structure of atoms in the workpiece.

It is desirable that the neutralization device has an orifice electrode as the first electrode and a grid electrode as the second electrode, and the voltage applying unit applies a variable voltage between the orifice electrode and the grid electrode to alternately extract positive ions and negative ions from the plasma and to alternately pass the positive ions and the negative ions through orifices defined in the orifice electrode.

With the above arrangement, the voltage applying unit serves not only to extract the positive ions and the negative ions, but also to neutralize the ions. When the orifice electrode is used for neutralizing the positive ions and the negative ions, a high neutralization efficiency can be obtained, and hence a beam diameter of an energetic beam can be increased inexpensively without increasing the size of the apparatus. Further, since the generated plasma is isolated from the workpiece by the orifice electrode, a radiation produced by the plasma is not substantially applied to the workpiece. Therefore, it is possible to reduce adverse effects on the workpiece due to the radiation such as an ultraviolet ray which would otherwise damage the workpiece.

The above and other objects, features, and advantages of the present invention will be apparent from the following description when taken in conjunction with the accompanying drawings which illustrates preferred embodiments of the present invention by way of example.

BRIEF DESCRIPTION OF DRAWINGS

FIG. 3 is a timing chart showing operating states of the beam processing apparatus shown in FIG. 1;

FIG. 13 is a schematic view showing a whole arrangement in which positive ions and negative ions are alternately applied to a workpiece without being neutralized in the beam processing apparatus of the third embodiment;

BEST MODE FOR CARRYING OUT THE INVENTION

A beam processing apparatus according to a first embodiment of the present invention will be described in detail below with reference to FIGS. 1 through 3.

Figure 1:
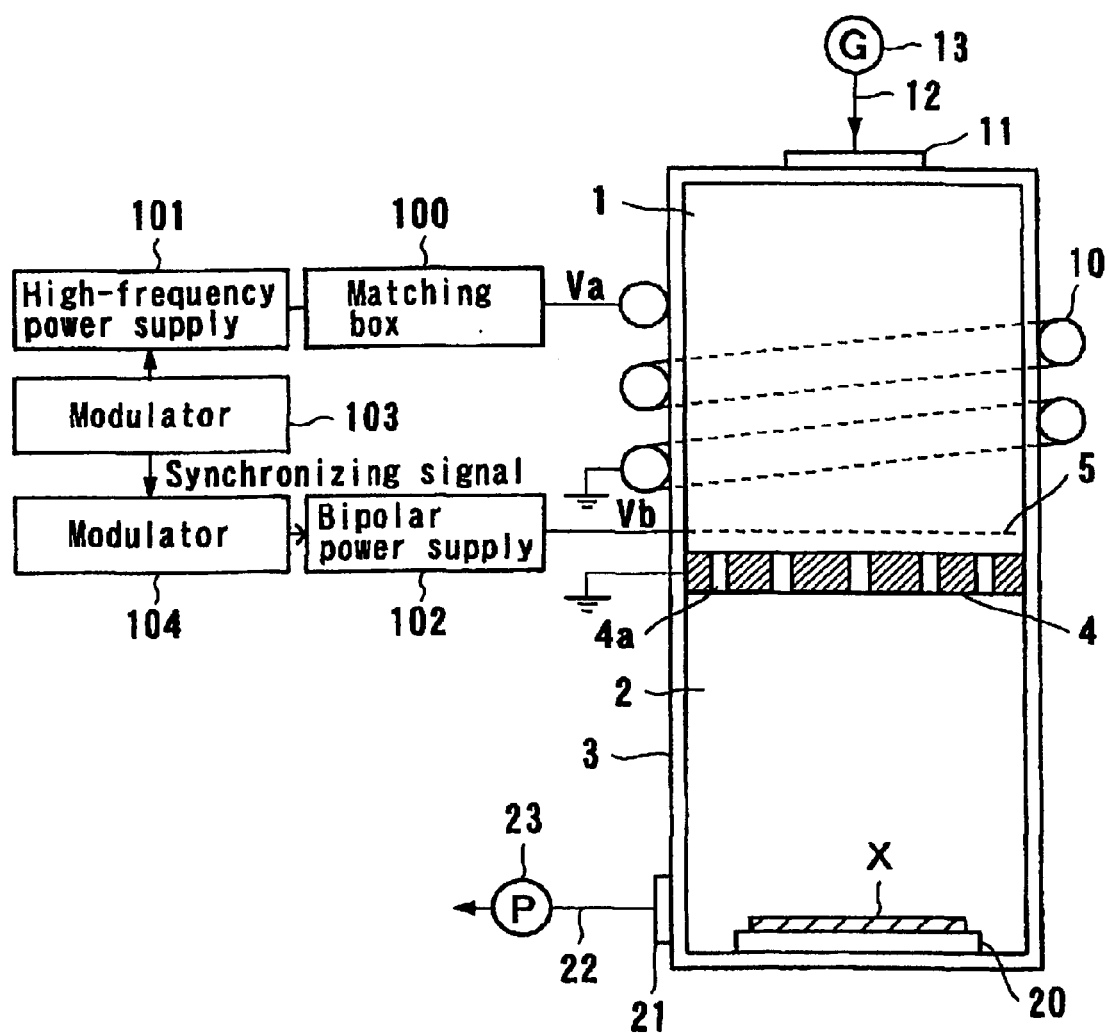
FIG. 1 is a schematic view showing a whole arrangement of a beam processing apparatus according to a first embodiment of the present invention.

FIG. 1 is a schematic view showing a whole arrangement of a beam processing apparatus according to a first embodiment of the present invention, with electric components in block form. As shown in FIG. 1, the beam processing apparatus comprises a cylindrical vacuum chamber 3 constituted by a beam generating chamber 1 for generating a neutral particle beam and a process chamber 2 for processing a workpiece X such as a semiconductor substrate, a glass workpiece, an organic workpiece, a ceramic workpiece, or the like. The beam generating chamber 1 of the vacuum chamber 3 has walls made of quartz glass or ceramics, and the process chamber 2 of the vacuum chamber 3 has walls made of metal.

The beam generating chamber 1 has a coil 10 disposed therearound for inductively coupled plasma (ICP). The coil 10 is housed in a water-cooled tube having an outside diameter of 8 mm, for example. The coil 10 of about two turns is wound around the beam generating chamber 1. The coil 10 is electrically connected through a matching box 100 to a high-frequency power supply 101, which applies a high-frequency voltage having a frequency of about 13.56 MHz, for example, to the coil 10. When a high-frequency current is supplied from the high-frequency power supply 101 via the matching box 100 to the coil 10, an induced magnetic field is produced in the beam generating chamber 1 by the coil 10. The varying magnetic field induces an electric field, which accelerates electrons to generate a plasma in the beam generating chamber 1. Thus, the coil 10, the matching box 100, and the high-frequency power supply 101 constitute a plasma generator for generating a plasma in the beam generating chamber 1.

The beam generating chamber 1 has a gas inlet port 11 defined in an upper portion thereof for introducing a gas into the beam generating chamber 1. The gas inlet port 11 is connected through a gas supply pipe 12 to a gas supply source 13, which supplies a gas such as $SF_6$, $CHF_3$, $CF_4$, $Cl_2$, Ar, $O_2$, $N_2$, and $C_4F_8$ to the beam generating chamber 1.

The process chamber 2 houses a workpiece holder 20 therein for holding a workpiece X. The workpiece X is placed on an upper surface of the workpiece holder 20. The process chamber 2 has a gas outlet port 21 defined in a sidewall thereof for discharging the gas from the process chamber 2. The gas outlet port 21 is connected through a gas outlet pipe 22 to a vacuum pump 23, which operates to maintain the process chamber 2 at a predetermined pressure.

An orifice plate (orifice electrode) 4 made of an electrically conductive material such as graphite is disposed in the lower end of the beam generating chamber 1 and electrically grounded. The orifice electrode 4 serves as a first electrode and also serves to neutralize ions. A thin-plate grid electrode (second electrode) 5 made of an electrically conductive material is disposed above the orifice electrode 4. The grid electrode 5 is electrically connected to a bipolar power supply (voltage applying unit) 102, which applies a low-frequency voltage having a frequency of about 400 kHz, for example, to the grid electrode 5.

Figure 2A:
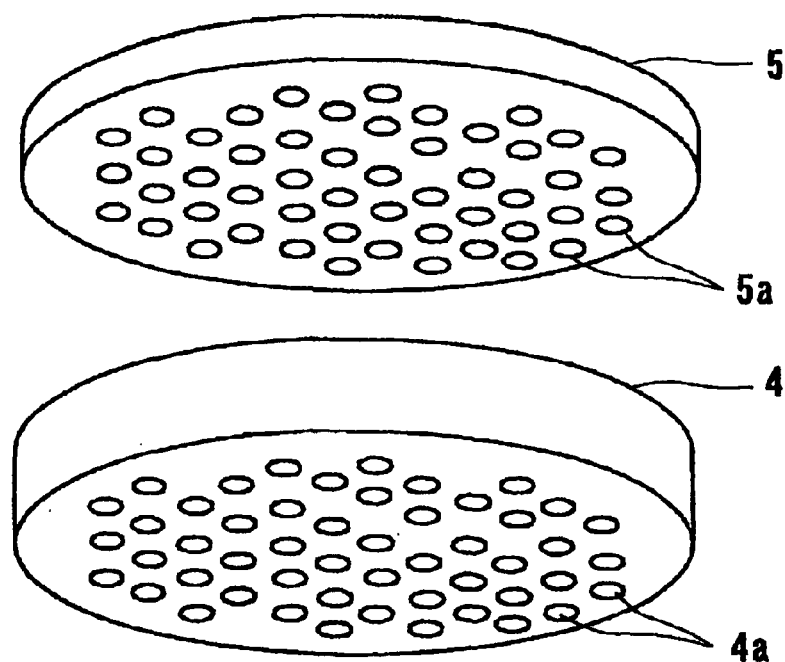
FIG. 2A is a perspective view showing an orifice electrode and a grid electrode in the beam processing apparatus shown in FIG. 1.
Figure 2B:
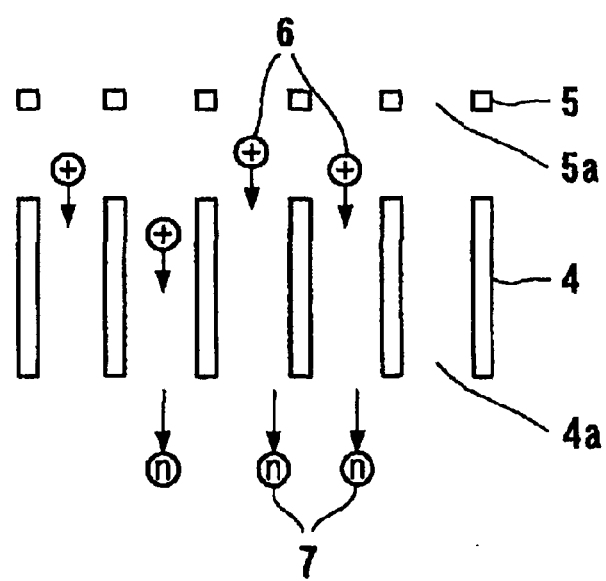
FIG. 2B is a vertical cross-sectional view partially showing the orifice electrode and the grid electrode shown in FIG. 2A, in which positive ions are being neutralized.

FIG. 2A is a perspective view showing the orifice electrode 4 and the grid electrode 5, and FIG. 2B is a vertical cross-sectional view partially showing the orifice electrode 4 and the grid electrode 5 shown in FIG. 2A. As shown in FIGS. 2A and 2B, the orifice electrode 4 has a number of orifices 4a defined therein, and the grid electrode 5 has a number of grid holes 5a defined therein. The grid electrode 5 may comprise a meshed wire, a punching metal, or the like.

The high-frequency power supply 101 which is connected to the coil 10 is connected a modulator 103, and the bipolar power supply 102 which is connected to the grid electrode 5 is connected to a modulator 104. Thus, the high-frequency power supply 101 and the bipolar power supply 102 are connected to each other through the modulators 103, 104. The application of the voltage by the bipolar power supply 102 is synchronized with the application of the voltage by the high-frequency power supply 101, based on synchronizing signals transmitted between the modulators 103, 104.

Operation of the beam processing apparatus according to the first embodiment will be described below. FIG. 3 is a timing chart showing operating states of the beam processing apparatus shown in FIG. 1. In FIG. 3, Va represents the potential of the coil 10, Te the electron temperature in the beam generating chamber 1, ne the electron density in the beam generating chamber 1, ni⁻ the negative ion density in the beam generating chamber 1, and Vb the potential of the grid electrode 5. The timing chart is schematically shown in FIG. 3, and the shown frequencies are different from the actual frequencies, for example.

The vacuum pump 23 is driven to evacuate the vacuum chamber 3, and then a gas such as $SF_6$, $CHF_3$, $CF_4$, $Cl_2$, Ar, $O_2$, $N_2$, or $C_4F_8$ is introduced from the gas supply source 13 into the beam generating chamber 1. As shown in FIG. 3, a high-frequency voltage having a frequency of about 13.56 MHz is applied to the coil 10 for 10 microseconds by the high-frequency power supply 101, so that a high-frequency electric field is produced in the beam generating chamber 1. The gas introduced into the beam generating chamber 1 is ionized by electrons that are accelerated by the high-frequency electric field, for thereby generating a high-density plasma in the beam generating chamber 1. The plasma is mainly composed of positive ions and heated electrons.

Then, the high-frequency voltage applied by the high-frequency power supply 101 is interrupted for 100 microseconds. Thereafter, the high-frequency voltage is applied again to the coil 10 for 10 microseconds by the high-frequency power supply 101 to heat the electrons in the plasma in the beam generating chamber 1. Thus, the above cycle is repeated. In this manner, the application of the high-frequency voltage for 10 microseconds and the interruption of the high-frequency voltage for 100 microseconds are alternately repeated. The period of time (100 microseconds) for which the high-frequency voltage is interrupted is sufficiently longer than a period of time in which the electrons in the plasma are attached to the residual process gas to generate negative ions, and sufficiently shorter than a period of time in which the electron density in the plasma is lowered to extinguish the plasma. The period of time (10 microseconds) for which the high-frequency voltage is applied is long enough to recover the energy of the electrons in the plasma which has been lowered during the interruption of the high-frequency voltage.

Negative ions can be generated efficiently and continuously by interrupting the high-frequency voltage after the energy of the electrons is increased in the plasma. While ordinary plasmas are mostly composed of positive ions and electrons, the beam processing apparatus according to the present embodiment can efficiently generate a plasma in which positive ions and negative ions coexist therein. Although the high-frequency voltage is interrupted for 100 microseconds in the above example, it may be interrupted for a period of time ranging from 50 to 100 microseconds to generate a large quantity of negative ions as well as positive ions in the plasma.

After 50 microseconds from the time when the high-frequency voltage applied by the high-frequency power supply 101 is stopped, a low-frequency voltage having a frequency of about 400 kHz is applied to the grid electrode 5 for 50 microseconds by the bipolar power supply 102. In the application of the low-frequency voltage, when the potential Vb of the grid electrode is higher than the potential (ground potential) of the orifice electrode 4 (for example, during a period "A" illustrated in FIG. 3), a potential difference is produced between the orifice electrode 4 and the grid electrode 5 so that orifice electrode 4 serves as a cathode and the grid electrode 5 serves as an anode. Therefore, the positive ions 6 (see FIG. 2B) that have passed through the grid electrode 5 toward the orifice electrode 4 are accelerated toward the orifice electrode 4 by the potential difference and introduced into the orifices 4a defined in the orifice electrode 4.

Most of the positive ions 6 that are passing through the orifices 4a in the orifice electrode 4 are collided with the sidewall surfaces of the orifices 4a and hence neutralized in the vicinity of solid sidewall surfaces of the orifices 4a, or are collided with gas molecules remaining within the orifices 4a and hence neutralized by charge exchange with the gas molecules, or are collided with electrons emitted from the surface of the orifice electrode 4 and hence neutralized by recombination with the electrons. Thus, the positive ions 6 are converted into neutral particles 7 (see FIG. 2B).

When the potential Vb of the grid electrode is lower than the potential (ground potential) of the orifice electrode 4 (for example, during a period "B" illustrated in FIG. 3), a potential difference is produced between the orifice electrode 4 and the grid electrode 5 so that orifice electrode 4 serves as an anode and the grid electrode 5 serves as a cathode. Therefore, the negative ions that have passed through the grid electrode 5 toward the orifice electrode 4 are accelerated toward the orifice electrode 4 by the potential difference and introduced into the orifices 4a defined in the orifice electrode 4. Most of the negative ions 6 that are passing through the orifices 4a in the orifice electrode 4 are collided with the sidewall surfaces of the orifices 4a and hence neutralized in the vicinity of solid sidewall surfaces of the orifices 4a, or are collided with gas molecules remaining within the orifices 4a and hence neutralized by charge exchange with the gas molecules. Thus, the negative ions are converted into neutral particles 7.

Thus, the negative and positive ions that have been neutralized when passing through the orifices 4a, i.e., the neutral particles, are then emitted as an energetic beam into the process chamber 2. The neutral particles 7 travel directly in the process chamber 2 and are applied to the workpiece X placed on the workpiece holder 20, for thereby etching the surface of the workpiece X, cleaning the surface of the workpiece X, modifying (e.g., nitriding or oxidizing) the surface of the workpiece X, or depositing a film on the workpiece X.

As described above, the neutral particles generated by neutralization of the positive ions and the neutral particles generated by neutralization of the negative ions are alternately applied to the workpiece. Therefore, two types of processes are alternately performed on the workpiece. For example, when gases of $Cl_2$ and Xe are introduced into the beam generating chamber 1, the workpiece is sputtered with use of Xe generated by neutralization of the positive ions and etched with use of chlorine generated by neutralization of the negative ions. In this case, the etching rate can be enhanced by chemical sputtering effect.

For example, a chlorine beam is applied to a workpiece to form thereon several atomic layers in which the chlorine and the workpiece are weakly bonded to each other, and then a Xe beam is applied to the workpiece. When the energy of the Xe beam is larger than the energy required for removing the atomic layers in which the chlorine and the workpiece are weakly bonded to each other, but is smaller than the energy required for removing the atomic layers in the workpiece which have a large bonding strength, the Xe beam can sputter the workpiece to remove only the atomic layers in which the chlorine and the workpiece are weakly bonded to each other. Thus, when reaction processes are properly selected and the energy of a beam is properly controlled, a workpiece can be etched without destruction of the crystal structure of atoms in the workpiece.

The orifice electrode 4 serves not only to neutralize the ions, but also to prevent a radiation produced by the plasma from being applied to the workpiece X. Specifically, since the beam generating chamber 1 where the plasma is generated is isolated from the workpiece X by the orifice electrode 4, the radiation produced by the plasma is not substantially applied to the workpiece X. Therefore, it is possible to reduce adverse effects on the workpiece X due to the radiation such as an ultraviolet ray which would otherwise damage the workpiece X.

Some charged particles may pass through the orifices 4a in the orifice electrode 4. In order to prevent such charged particles from being applied to the workpiece X, a deflector or an electron trap may be disposed downstream of the orifice electrode 4. A voltage is applied to the deflector in a direction perpendicular to a beam traveling direction to change the traveling direction of charged particles, for thereby preventing the charged particles from being applied to the workpiece X. The electron trap produces a magnetic field of about 100 gauss in a direction perpendicular to a beam traveling direction to change the traveling direction of electrons, for thereby preventing the electrons from being applied to the workpiece X.

As well known in the art, when an insulated workpiece such as a workpiece made of glass or ceramics is processed, charge build-up may be developed on the surface of the insulated workpiece. However, by applying neutralized particles to the insulating workpiece as described above, various processes including an etching process and a deposition process can be performed on the insulating workpiece with high accuracy in such a state that an amount of charge build-up is reduced. Various types of gases may be introduced into the beam generating chamber 1 according to the type of process to be performed on the workpiece X. For example, in a dry etching process, oxygen or a halogen gas may selectively be used according to the kind of the workpiece X.

Figure 4:
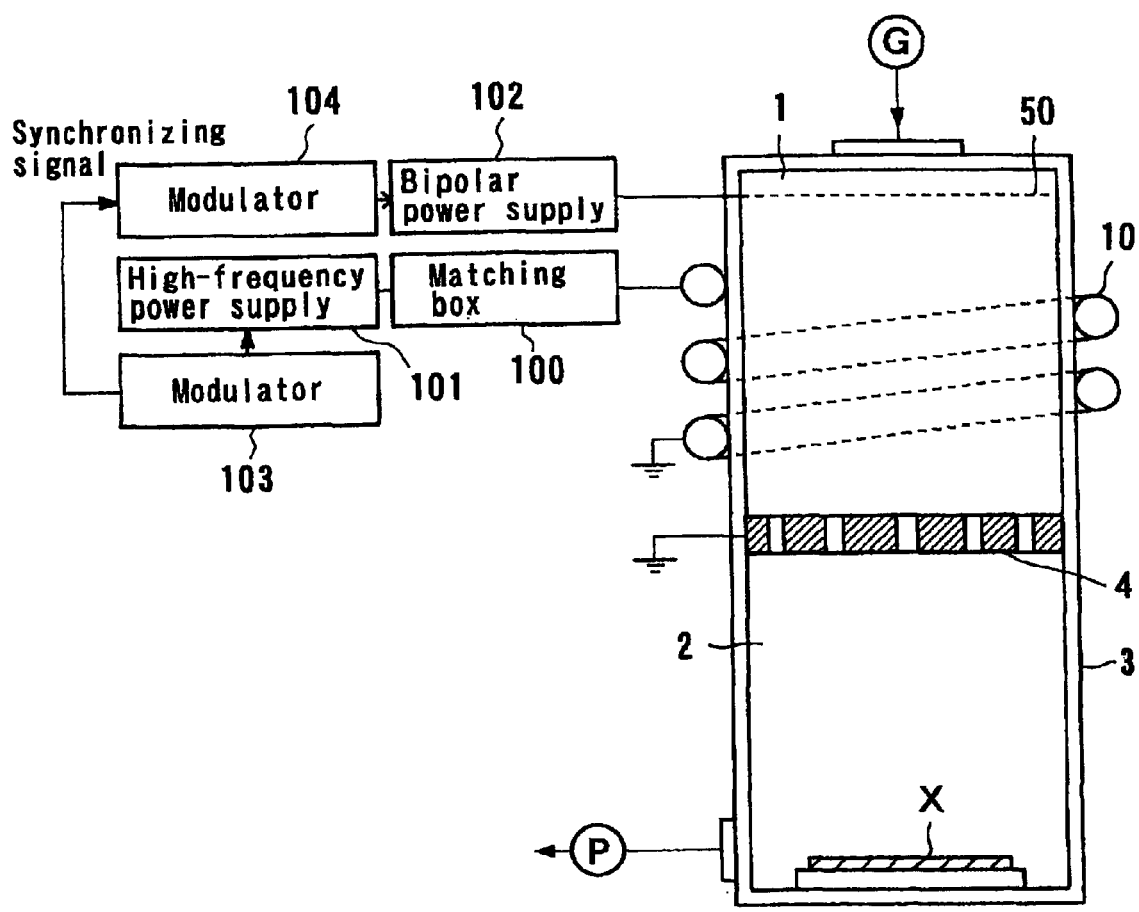
FIG. 4 is a schematic view showing a whole arrangement of a beam processing apparatus according to a modification of the first embodiment of the present invention.

In the first embodiment, the grid electrode 5 is positioned downstream of the coil 10. However, the grid electrode may be positioned upstream of the coil 10. In such a case, the grid electrode may have no grid holes therein. FIG. 4 is a schematic view showing a whole arrangement of a beam processing apparatus where a grid electrode 50 is disposed upstream of the coil 10. In the beam processing apparatus shown in FIG. 4, negative ions in a plasma generated in the beam generating chamber 1 are accelerated by a voltage applied between the grid electrode 50 and the orifice electrode 4.

In the first embodiment, the orifice electrode and the grid electrode are used as a neutralization device for neutralizing ions. However, the neutralization device is not limited to the illustrated example. The present invention is also applicable to neutralization devices which perform the following processes, for example.

1) An electron beam is applied to ions extracted from a plasma to neutralize the ions.
2) A neutral gas is introduced into a path of ions extracted from a plasma to form a region of the neutral gas having a high pressure, and the ions are passed through this region for neutralization.
3) A light is applied to ions to neutralize the ions.
4) Ions are be vibrated by a high-frequency electric field for neutralization.
5) A electron cloud is formed in a path of ions extracted from a plasma, and the ions are passed through the electron cloud for neutralization.

Figure 5:
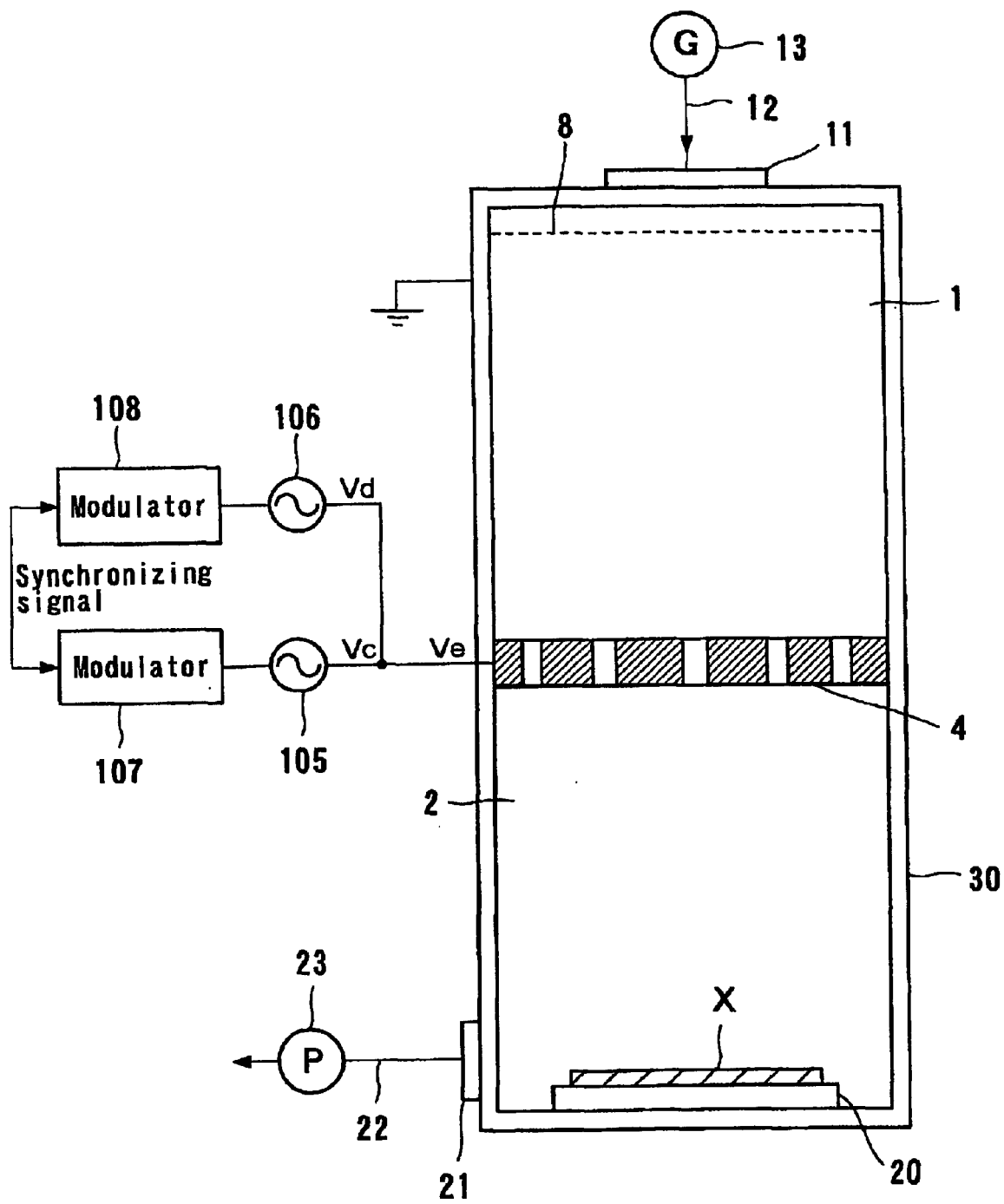
FIG. 5 is a schematic view showing a whole arrangement of a beam processing apparatus according to a second embodiment of the present invention.
Figure 6:
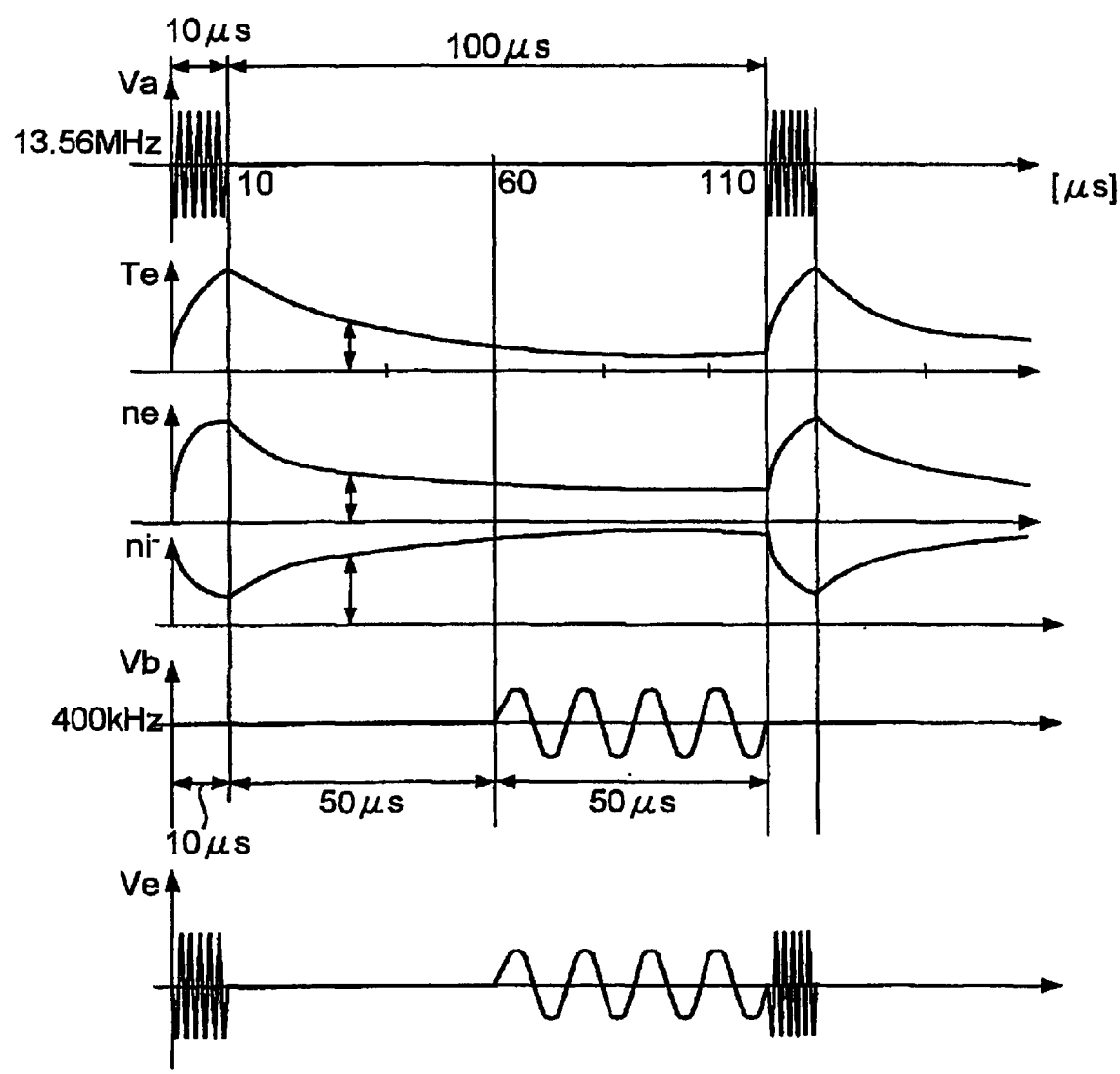
FIG. 6 is a timing chart showing operating states of the beam processing apparatus shown in FIG. 5.

A beam processing apparatus according to a second embodiment of the present invention will be described below with reference to FIGS. 5 and 6. FIG. 5 is a schematic view showing a whole arrangement of a beam processing apparatus according to a second embodiment of the present invention, with electric components in block form. In FIG. 5, like parts and components are denoted by the same reference numerals and characters as those of the first embodiment and will not be described below.

In the present embodiment, the beam processing apparatus comprises a vacuum chamber 30 made of metal, i.e., a metallic chamber. As shown in FIG. 5, a thin-plate grid electrode (second electrode) 8 made of an electrically conductive material is disposed in an upstream end of the vacuum chamber 30. The vacuum chamber 30 and the grid electrode 8 are electrically connected to each other and electrically grounded.

An AC power supply 105 and an AC power supply 106, which are connected parallel to each other, are electrically connected to the orifice electrode (a first electrode) 4. The power supplies 105, 106 are also connected to modulators 107, 108, respectively. The modulator 107 for the AC power supply 105 and the modulator 108 for the AC power supply 106 are synchronized with each other by synchronizing signals. A voltage applying unit is constituted by the AC power supplies 105, 106, and the modulators 107, 108. The vacuum chamber 30 and the orifice electrode 4 are electrically insulated from each other by an insulating material (not shown). The surfaces of the orifice electrode 4 may be covered with dielectric films.

Operation of the beam processing apparatus according to the second embodiment will be described below. FIG. 6 is a timing chart showing operating states of the beam processing apparatus shown in FIG. 5. In FIG. 6, Vc represents the potential of the AC power supply 105, Te the electron temperature in the beam generating chamber 1, ne the electron density in the beam generating chamber 1, $ni^-$ the negative ion density in the beam generating chamber 1, Vd the potential of the AC power supply 106, and Ve the potential of the orifice electrode 4. The timing chart is schematically shown in FIG. 6, and the shown frequencies are different from the actual frequencies, for example.

The vacuum pump 23 is driven to evacuate the vacuum chamber 30, and then a gas is introduced from the gas supply source 13 into the beam generating chamber 1. As shown in FIG. 6, a high-frequency voltage having a frequency of about 13.56 MHz is applied to the orifice electrode 4 for 10 microseconds by the AC power supply 105, so that a high-frequency electric field is produced in the beam generating chamber 1. The gas introduced into the beam generating chamber 1 is ionized by electrons that are accelerated by the high-frequency electric field, for thereby generating a high-density plasma in the beam generating chamber 1.

Then, the high-frequency voltage applied by the AC power supply 105 is interrupted for 100 microseconds. Thereafter, the high-frequency voltage is applied again to the orifice electrode 4 for 10 microseconds by the AC power supply 105 to heat the electrons in the plasma in the beam generating chamber 1. Thus, the above cycle is repeated. In this manner, the application of the high-frequency voltage for 10 microseconds and the interruption of the high-frequency voltage for 100 microseconds are alternately repeated.

Negative ions can be generated efficiently and continuously by interrupting the high-frequency voltage after the energy of the electrons is increased in the plasma. While ordinary plasmas are mostly composed of positive ions and electrons, the beam processing apparatus according to the present embodiment can efficiently generate a plasma in which positive ions and negative ions coexist therein.

After 50 microseconds from the time when the high-frequency voltage applied by the AC power supply 105 is stopped, a low-frequency voltage having a frequency of 400 kHz is applied to the orifice electrode 4 for 50 microseconds by the AC power supply 106. As in the case of the first embodiment, positive and negative ions are alternately accelerated toward the orifice electrode 4 by the potential differences produced by the low-frequency voltage, and introduced into the orifices 4a defined in the orifice electrode 4.

Most of the positive and negative ions that are passing through the orifices 4a are alternately neutralized and converted into neutral particles as in the case of the first embodiment. The neutral particles are then emitted as an energetic beam into the process chamber 2. The neutral particles travel directly in the process chamber 2 and are applied to the workpiece X placed on the workpiece holder 20.

According to the second embodiment, as described above, by alternately applying the high-frequency voltage and the low-frequency voltage between the orifice electrode 4 and the grid electrode 8, a plasma can be generated in the beam generating chamber, and negative ions can be extracted from the generated plasma. Therefore, it is not necessary to provide a separate plasma generator for generating a plasma. Thus, the beam processing apparatus can be made compact in structure, and a beam diameter of an energetic beam can be increased inexpensively.

Figure 7:
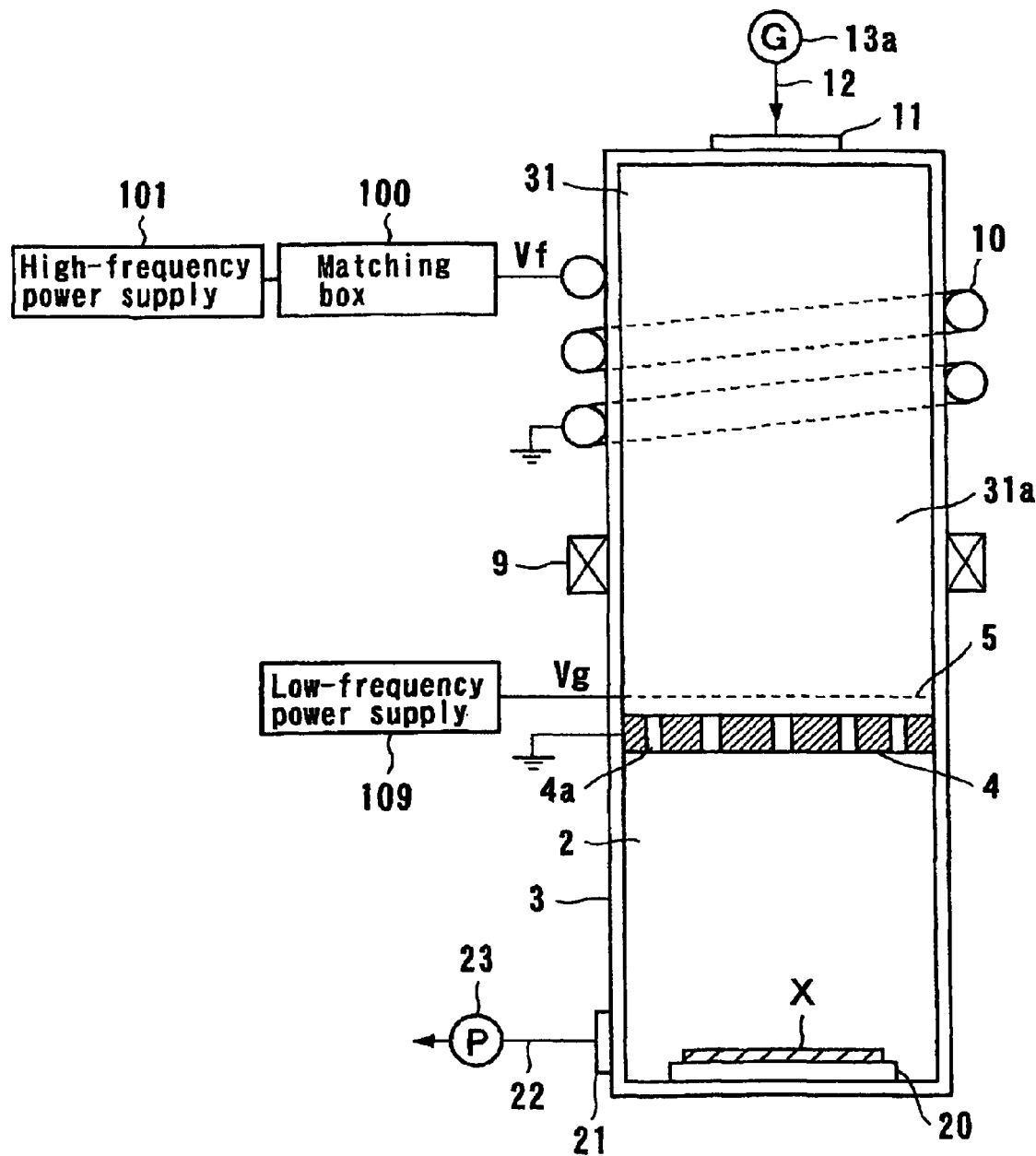
FIG. 7 is a schematic view showing a whole arrangement of a beam processing apparatus according to a third embodiment of the present invention.
Figure 8:
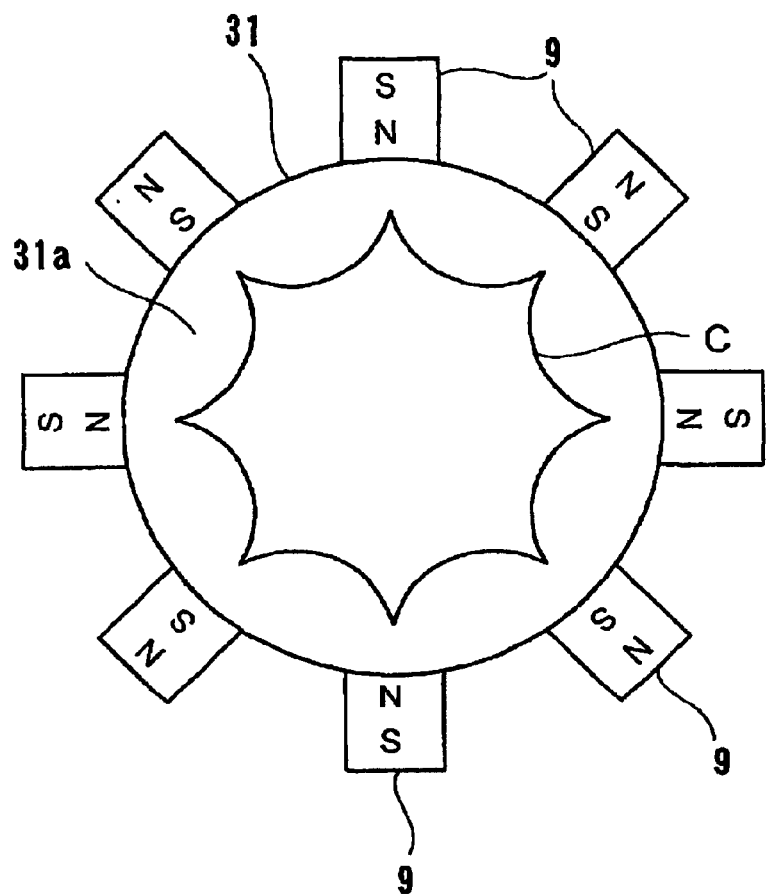
FIG. 8 is a cross-sectional view showing an electron cloud generator in the beam processing apparatus shown in FIG. 7.
Figure 9:
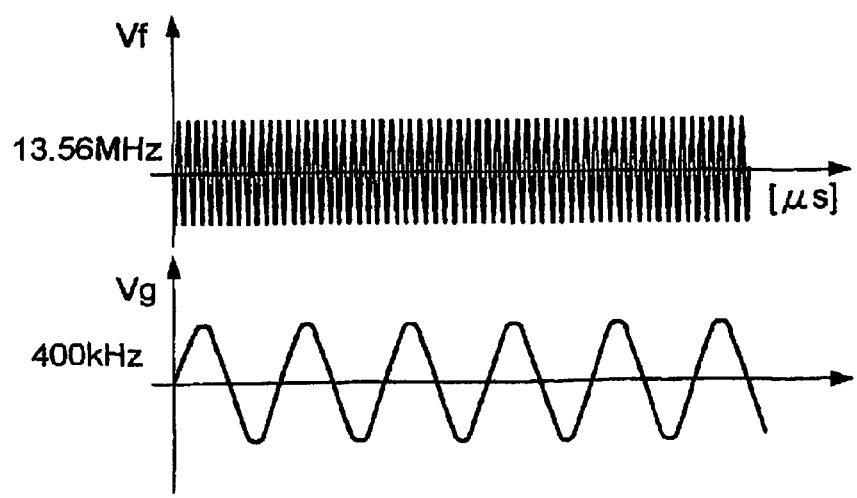
FIG. 9 is a timing chart showing operating states of the beam processing apparatus shown in FIG. 7.

A beam processing apparatus according to a third embodiment of the present invention will be described below with reference to FIGS. 7 through 9. FIG. 7 is a schematic view showing a whole arrangement of a beam processing apparatus according to a third embodiment of the present invention, with electric components in block form. In FIG. 7, like parts and components are denoted by the same reference numerals and characters as those of the first embodiment and will not be described below.

The present embodiment differs from the first embodiment in that a beam generating chamber 31 has a negative ion generating chamber 31a formed downstream of a coil 10 for attaching electrons to a residual gas to generate negative ions. Thus, the beam processing apparatus in the present embodiment comprises a downstream beam processing apparatus having a negative ion generating chamber formed downstream of a generated plasma.

The negative ion generating chamber 31a may have an electron cloud generator for generating an electron cloud within the negative ion generating chamber 31a as needed. Specifically, permanent magnets 9 are disposed around the negative ion generating chamber 31a at predetermined circumferential intervals, as shown in FIG. 8. The permanent magnets 9 are arranged so that the magnetic poles of the adjacent permanent magnets are opposed to each other. With this arrangement, the permanent magnets 9 produce a magnetic field in the negative ion generating chamber 31a, and electrons in the plasma move along an orbital path C shown in FIG. 8 to form an electron cloud in the negative ion generating chamber 31a. In the present embodiment, the electron cloud generator utilizes the permanent magnets 9. However, the electron cloud generator may utilize an electric field applied in the negative ion generating chamber 31.

The grid electrode 5 is electrically connected to a low-frequency power supply 109, which applies a low-frequency voltage having a frequency of about 400 kHz, for example, to the grid electrode 5. In the present embodiment, the beam processing apparatus has no modulators, unlike the first embodiment.

Operation of the beam processing apparatus according to the third embodiment will be described below. FIG. 9 is a timing chart showing operating states of the beam processing apparatus shown in FIG. 7. In FIG. 9, Vf represents the potential of the coil 10, and Vg represents the potential of the grid electrode 5. The timing chart is schematically shown in FIG. 9, and the shown frequencies are different from the actual frequencies, for example.

The vacuum pump 23 is driven to evacuate the vacuum chamber 3, and then a gas such as $SF_6$, $CHF_3$, $CF_4$, $Cl_2$, Ar, $O_2$, or $C_4F_8$ is introduced from the gas supply source 13 into the beam generating chamber 31. As shown in FIG. 9, a high-frequency voltage having a frequency of about 13.56 MHz is applied to the coil 10 for 10 microseconds by the high-frequency power supply 101, so that a high-frequency electric field is produced in the beam generating chamber 31. The gas introduced into the beam generating chamber 31 is ionized by electrons that are accelerated by the high-frequency electric field, for thereby generating a high-density plasma in the beam generating chamber 31. The plasma is mainly composed of positive ions and heated electrons.

As described above, in the present embodiment, the negative ion generating chamber 31a is provided downstream of the plasma. In the negative ion generating chamber 31a, electrons lowered in electron temperature are attached to the residual gas to generate negative ions. Therefore, positive ions, negative ions, and electrons are present in the negative ion generating chamber 31a.

At the same time when the high-frequency voltage is applied by the high-frequency power supply 101, a low-frequency voltage having a frequency of about 400 kHz is applied between the grid electrode 5 and the orifice electrode 4 by the low-frequency power supply 109. As in the case of the first embodiment, positive and negative ions are alternately accelerated toward the orifice electrode 4 by the potential differences produced by the low-frequency voltage, and introduced into the orifices 4a defined in the orifice electrode 4.

Most of the positive and negative ions that are passing through the orifices 4a are alternately neutralized and converted into neutral particles as in the case of the first embodiment. The neutral particles are then emitted as an energetic beam into the process chamber 2. The neutral particles travel directly in the process chamber 2 and are applied to the workpiece X placed on the workpiece holder 20.

Figure 10:
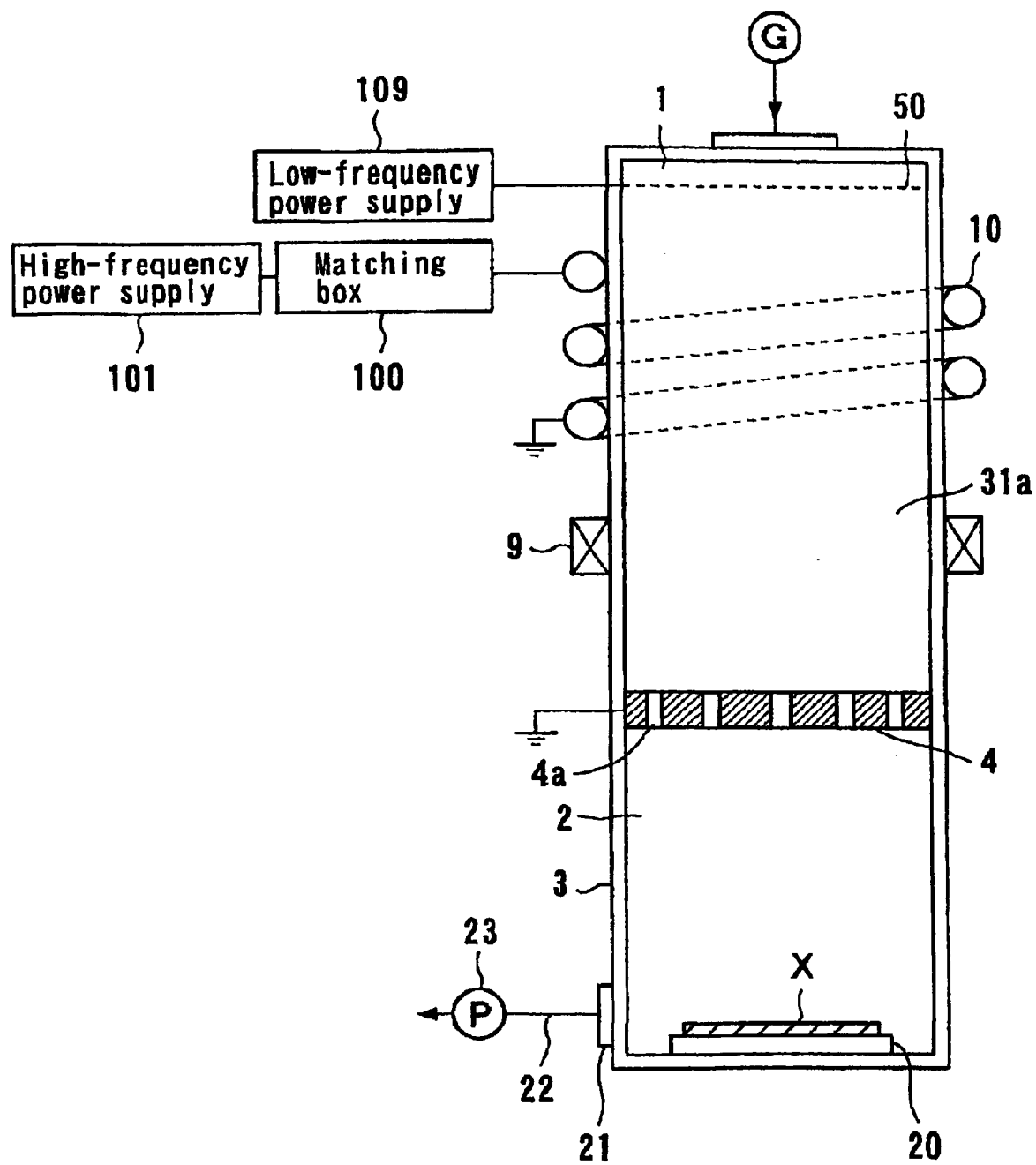
FIG. 10 is a schematic view showing a whole arrangement of a beam processing apparatus according to a modification of the third embodiment of the present invention.

The grid electrode may be positioned upstream of the coil 10. FIG. 10 is a schematic view showing a whole arrangement of a beam processing apparatus where a grid electrode 50 is disposed upstream of the coil 10. In the beam processing apparatus shown in FIG. 10, positive and negative ions in a plasma generated in the beam generating chamber 1 are accelerated by a voltage applied between the grid electrode 50 and the orifice electrode 4.

In the above embodiments, positive ions and negative ions are alternately extracted from a plasma and neutralized. However, positive ions and negative ions may alternately be extracted from a plasma and directly applied as a positive ion beam and a negative ion beam to a workpiece without being neutralized.

Figure 11:
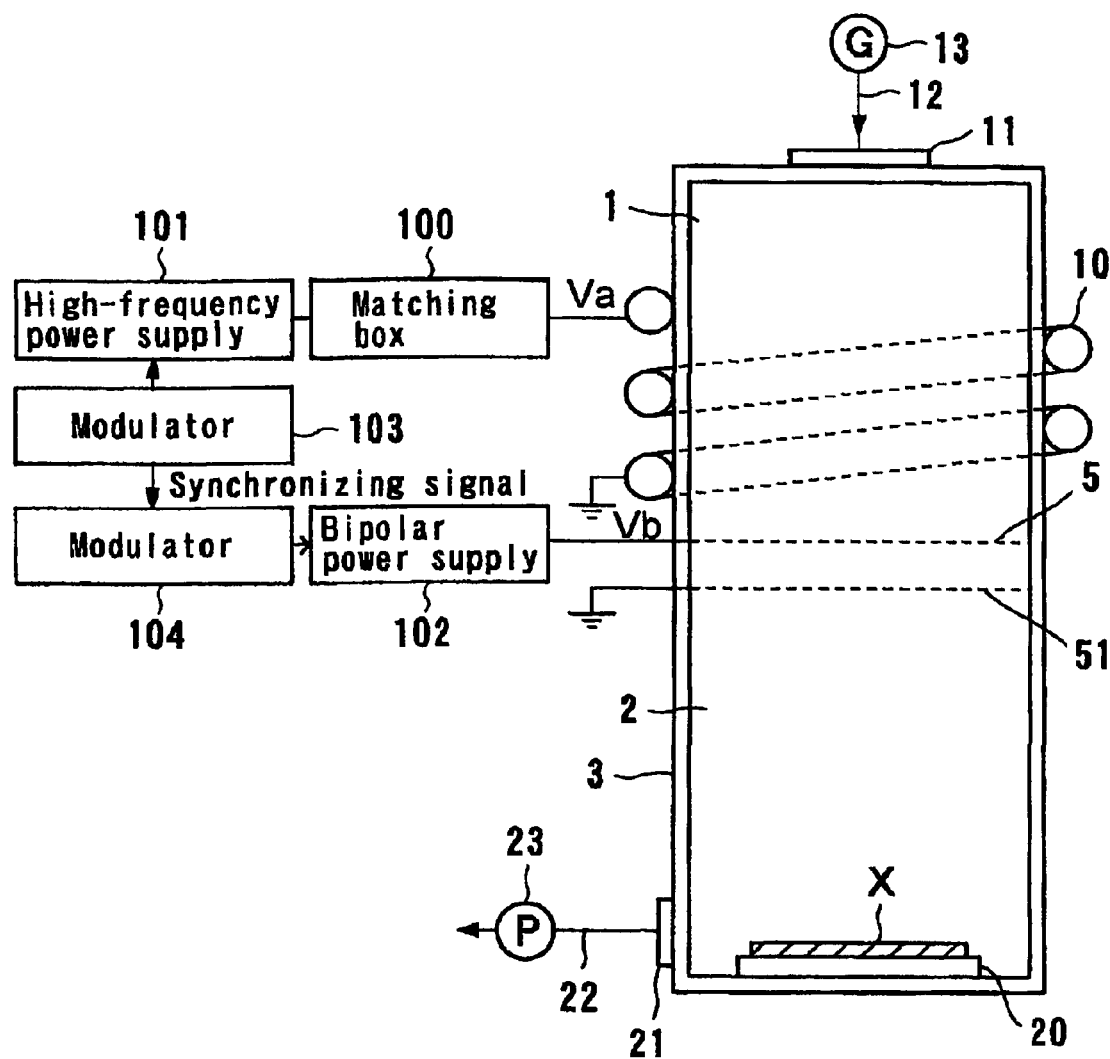
FIG. 11 is a schematic view showing a whole arrangement in which positive ions and negative ions are alternately applied to a workpiece without being neutralized in the beam processing apparatus of the first embodiment.

FIG. 11 is a schematic view showing a whole arrangement in which positive ions and negative ions are alternately applied as a positive ion beam and a negative ion beam to a workpiece X without being neutralized in the beam processing apparatus of the first embodiment. In FIG. 11, a thin-plate grid electrode (second electrode) 51 made of an electrically conductive material is disposed instead of the orifice electrode. The grid electrode 51 is electrically grounded as in the case of the orifice electrode in the first embodiment. With this arrangement, a high-frequency voltage is applied to a coil 10 for 10 microseconds by the high-frequency power supply 101 to generate a high-density plasma in the beam generating chamber 1. After 50 microseconds from the time when the high-frequency voltage applied by the high-frequency power supply 101 is stopped, a low-frequency voltage is applied to the grid electrode 5 for 50 microseconds by the bipolar power supply 102. As in the case of the first embodiment, positive ions and negative ions are alternately emitted from the grid electrode 51 and applied as a positive ion beam and a negative ion beam to the workpiece X.

Figure 12:
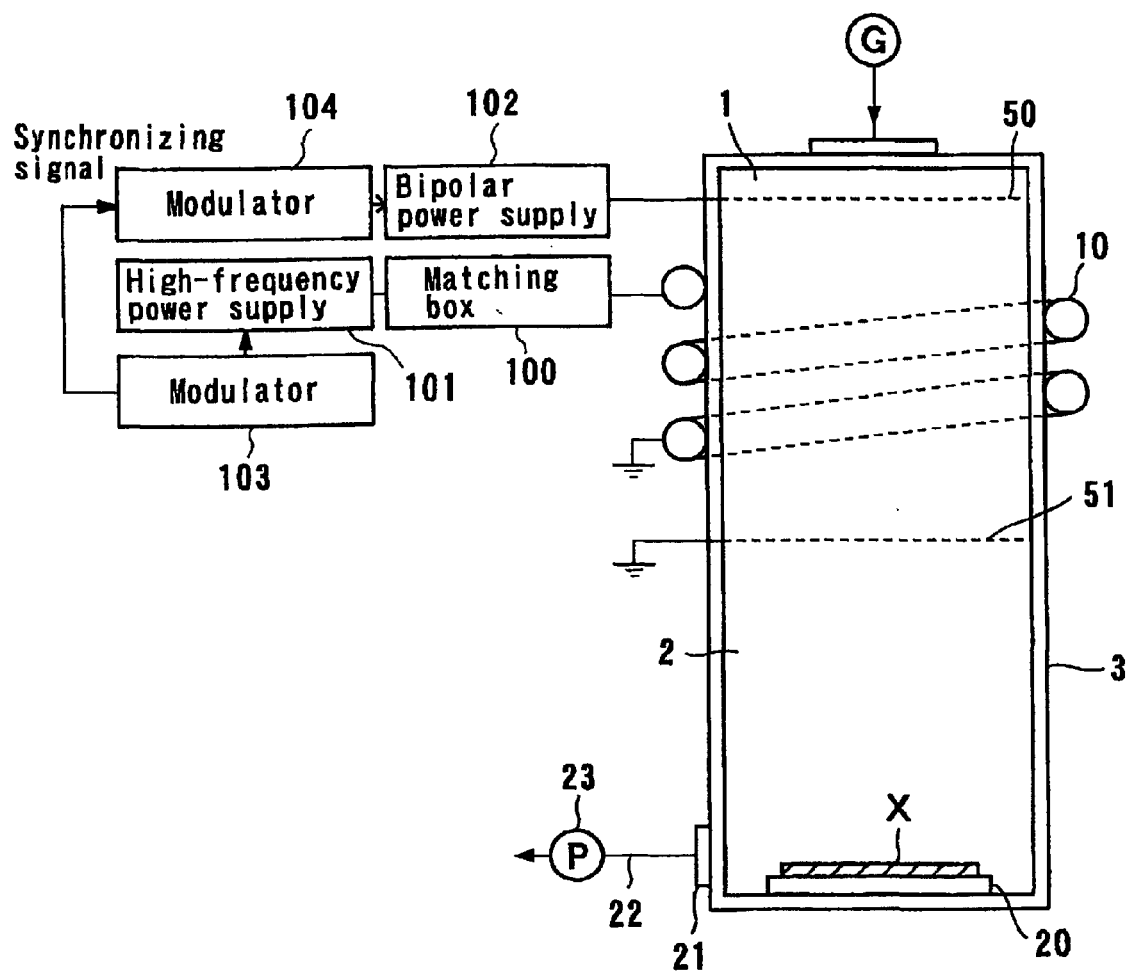
FIG. 12 is a schematic view showing a whole arrangement in which positive ions and negative ions are alternately applied to a workpiece without being neutralized in the beam processing apparatus shown in FIG. 4.
Figure 14:
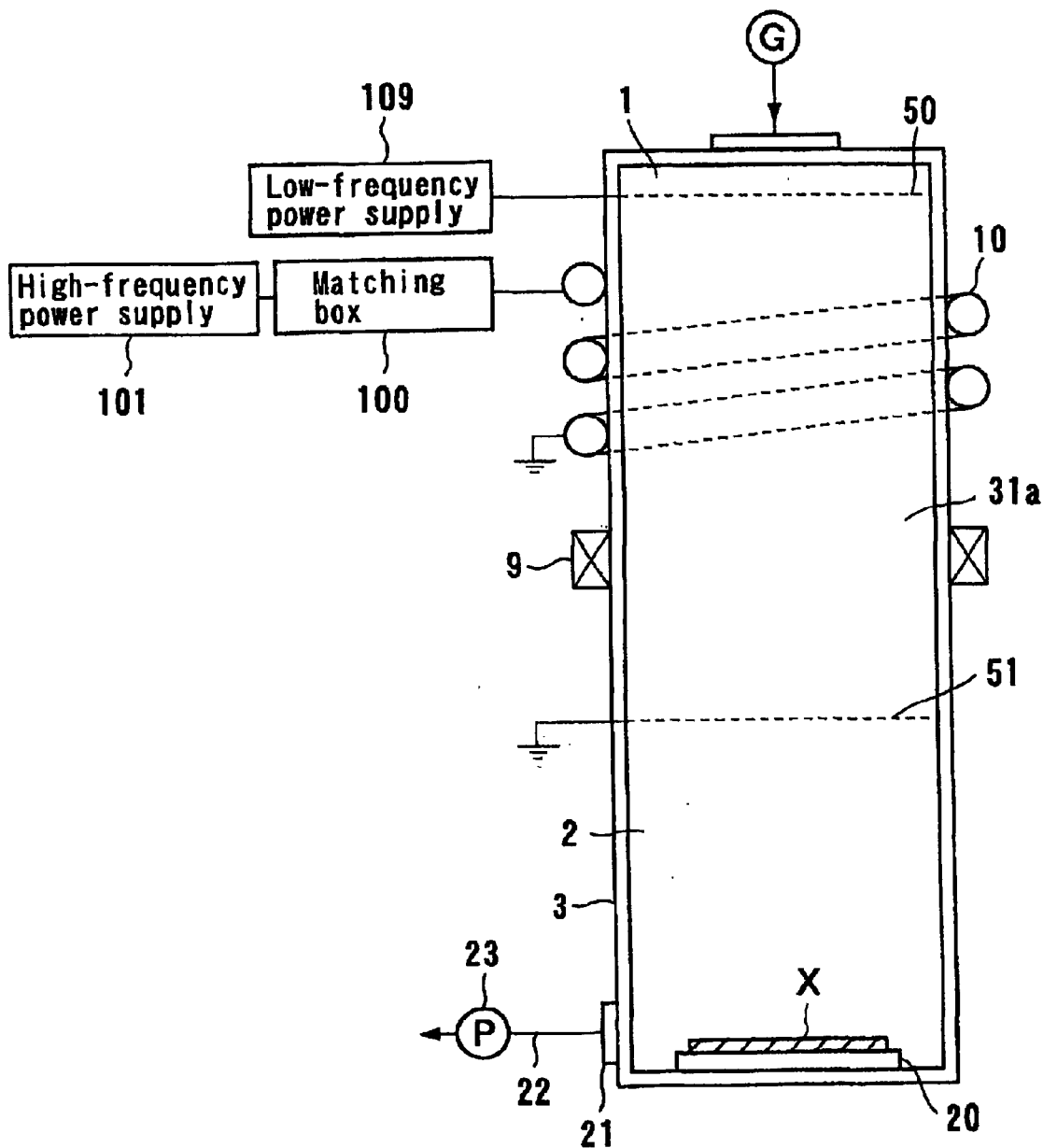
FIG. 14 is a schematic view showing a whole arrangement in which positive ions and negative ions are alternately applied to a workpiece without being neutralized in the beam processing apparatus shown in FIG. 10.

In the embodiment shown in FIG. 4, the third embodiment, and the embodiment shown in FIG. 10, positive ions and negative ions may be alternately applied to the workpiece X without being neutralized. FIGS. 12 through 14 are schematic views showing a whole arrangement in such cases. FIG. 12 corresponds to the embodiment shown in FIG. 4, FIG. 13 the third embodiment, and FIG. 14 the embodiment shown in FIG. 10.

Figure 15:
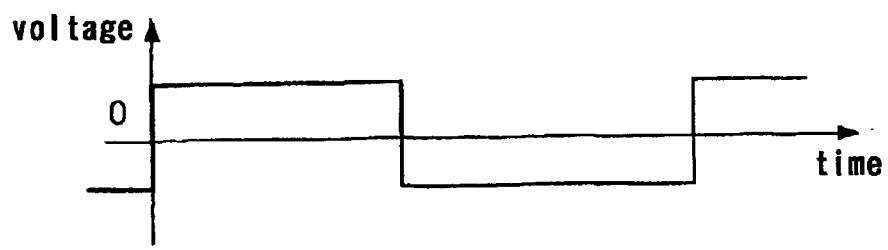
FIG. 15 is a timing chart showing an example of a voltage to be applied instead of a low-frequency voltage.

In the above embodiments, the plasma is generated with use of a coil for ICP. However, the plasma may be generated with use of an electron cyclotron resonance source (ECR source), a coil for helicon wave plasma, a microwave, or the like. The frequency of the high-frequency voltage is not limited to 13.56 MHz, but may be in the range from 1 MHz to 20 GHz. Further, the frequency of the low-frequency voltage is not limited to 400 kHz. For example, a voltage of a rectangular wave as shown in FIG. 15 may be applied instead of the low-frequency voltage.

Although certain preferred embodiments of the present invention have been shown and described in detail, it should be understood that various changes and modifications may be made therein without departing from the scope of the appended claims.

Industrial Applicability

The present invention is suitable for use in a beam processing apparatus for generating a highly directional and highly dense particle beam from a high-density plasma and processing a workpiece with the generated particle beam.

What is claimed is:

1. A beam processing apparatus comprising:
   a workpiece holder for holding a workpiece;
   a plasma generator for generating a plasma in a vacuum chamber, said plasma generator alternately performing application of a high-frequency voltage for generating positive ions and electrons and interruption of said high-frequency voltage for generating negative ions repeatedly;
   a first electrode disposed in said vacuum chamber;
   a second electrode disposed upstream of said first electrode in said vacuum chamber; and
   a voltage applying unit for applying a variable voltage between said first electrode and said second electrode to alternately extract positive ions and negative ions from the plasma generated by said plasma generator.

2. A beam processing apparatus comprising;
   a workpiece holder for holding a workpiece;
   a plasma generator for generating a plasma in a vacuum chamber:
   a negative ion generating chamber disposed downstream of said plasma generator for attaching electrons to a residual gas to generate negative ions therein;
   a first electrode disposed in said vacuum chamber;
   a second electrode disposed upstream of said first electrode in said vacuum chamber; and
   a voltage applying unit for applying a variable voltage between said first electrode and said second electrode to alternately extract positive ions and negative ions from the plasma generated by said plasma generator.

3. A beam processing apparatus according to claim 2, wherein said negative ion generating chamber has an electron cloud generator for generating an electron cloud within said negative ion generating chamber.

4. A beam processing apparatus according to claim 1, further comprising a neutralization device for alternately neutralizing said positive ions and said negative ions extracted by said voltage applying unit.

5. A beam processing apparatus according to claim 4, wherein said neutralization device has an orifice electrode as said first electrode and a grid electrode as said second electrode; and said voltage applying unit applies a variable voltage between said orifice electrode and said grid electrode to alternately extract positive ions and negative ions from said plasma and to alternately pass said positive ions and said negative ions through orifices defined in said orifice electrode.

6. A beam processing apparatus comprising:

a first electrode disposed in a vacuum chamber;

a workpiece holder disposed downstream of said first electrode for holding a workpiece;

a second electrode disposed upstream of said first electrode in said vacuum chamber; and a voltage applying unit for applying a variable voltage between said first electrode and said second electrode to generate a plasma between said first electrode and said second electrode and to alternately extract positive ions and negative ions from the generated plasma.

7. A beam processing apparatus according to claim 6, further comprising a neutralization device for alternately neutralizing said positive ions and said negative ions extracted by said voltage applying unit.

8. A beam processing apparatus according to claim 7, wherein said neutralization device has an orifice electrode as said first electrode and a grid electrode as said second electrode; and said voltage applying unit applies a variable voltage between said orifice electrode and said grid electrode to alternately extract positive ions and negative ions from said plasma and to alternately pass said positive ions and said negative ions through orifices defined in said orifice electrode.

9. A beam processing apparatus according to claim 2, further comprising a neutralization device for alternately neutralizing said positive ions and said negative ions extracted by said voltage applying unit.

10. A beam processing apparatus according to claim 9, wherein said neutralization device has an orifice electrode as said first electrode and a grid electrode as said second electrode; and said voltage applying unit applies a variable voltage between said orifice electrode and said grid electrode to alternately extract positive ions and negative ions from said plasma and to alternately pass said positive ions and said negative ions through orifices defined in said orifice electrode.

* * * * *

UNITED STATES PATENT AND TRADEMARK OFFICE
CERTIFICATE OF CORRECTION

PATENT NO.     : 6,849,857 B2                                          Page 1 of 1
DATED          : February 1, 2005
INVENTOR(S)    : Katsunori Ichiki et al.

It is certified that error appears in the above-identified patent and that said Letters Patent is hereby corrected as shown below:

<u>Title page,</u>
Item [86], §371 (c)(1), (2), (4) Date, please change "Sep. 29, 2003" into -- Sep. 24, 2003 --.

Signed and Sealed this

Seventh Day of June, 2005

JON W. DUDAS
*Director of the United States Patent and Trademark Office*